(12) United States Patent
Lunsman et al.

(10) Patent No.: US 11,589,477 B2
(45) Date of Patent: Feb. 21, 2023

(54) VOID FREE INJECTION-MOLDED COLD PLATES

(71) Applicant: HEWLETT PACKARD ENTERPRISE DEVELOPMENT LP, Houston, TX (US)

(72) Inventors: Harvey Lunsman, Chippewa Falls, WI (US); Tahir Cader, Liberty Lake, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 579 days.

(21) Appl. No.: 16/580,605

(22) Filed: Sep. 24, 2019

(65) Prior Publication Data

US 2021/0092869 A1    Mar. 25, 2021

(51) Int. Cl.
| | |
|---|---|
| *H05K 7/20* | (2006.01) |
| *F28F 3/02* | (2006.01) |
| *F28F 3/12* | (2006.01) |
| *B29C 45/26* | (2006.01) |

(52) U.S. Cl.
CPC ......... *H05K 7/20254* (2013.01); *B29C 45/26* (2013.01); *F28F 3/02* (2013.01); *F28F 3/12* (2013.01); *B29C 45/2624* (2013.01); *B29C 45/2628* (2013.01); *H05K 7/20927* (2013.01)

(58) Field of Classification Search
CPC . B29C 45/26; B29C 45/2624; B29C 45/2628; B29C 45/14598; B29C 33/0033; B29C 33/505
See application file for complete search history.

(56) References Cited

U.S. PATENT DOCUMENTS

| | | | | |
|---|---|---|---|---|
| 2005/0284611 | A1* | 12/2005 | Bibeau | H01L 23/473 257/E23.098 |
| 2010/0328892 | A1* | 12/2010 | Madison, Jr. | B23P 15/26 165/185 |
| 2016/0270258 | A1* | 9/2016 | Rai | H05K 7/20927 |
| 2017/0015039 | A1* | 1/2017 | Hughes | B29C 33/02 |
| 2020/0404812 | A1* | 12/2020 | Gao | H05K 7/2079 |
| 2021/0046472 | A1* | 2/2021 | Lee | B01L 3/00 |

\* cited by examiner

*Primary Examiner* — Alison L Hindenlang
*Assistant Examiner* — Virak Nguon
(74) *Attorney, Agent, or Firm* — Nolte Intellectual Property Law Group

(57) ABSTRACT

Methods and systems for creating cold plates are disclosed. For example, in one example method for manufacturing a cold plate made of a thermally-conductive plastic includes performing a first injection-molding process using the thermally-conductive plastic to produce a first unitary body, the first unitary body including one or more elongated sections forming a unitary body, performing a second injection-molding process using the thermally-conductive plastic to produce a second unitary body, the second unitary body incorporating the first unitary body so as to cover a majority of the first unitary body and form a respective coolant pipe body corresponding to each elongated section, and performing a machining process on the second unitary body so as to create a conduit in each respective coolant pipe body suitable for a fluid to pass through to create respective coolant pipes.

12 Claims, 9 Drawing Sheets

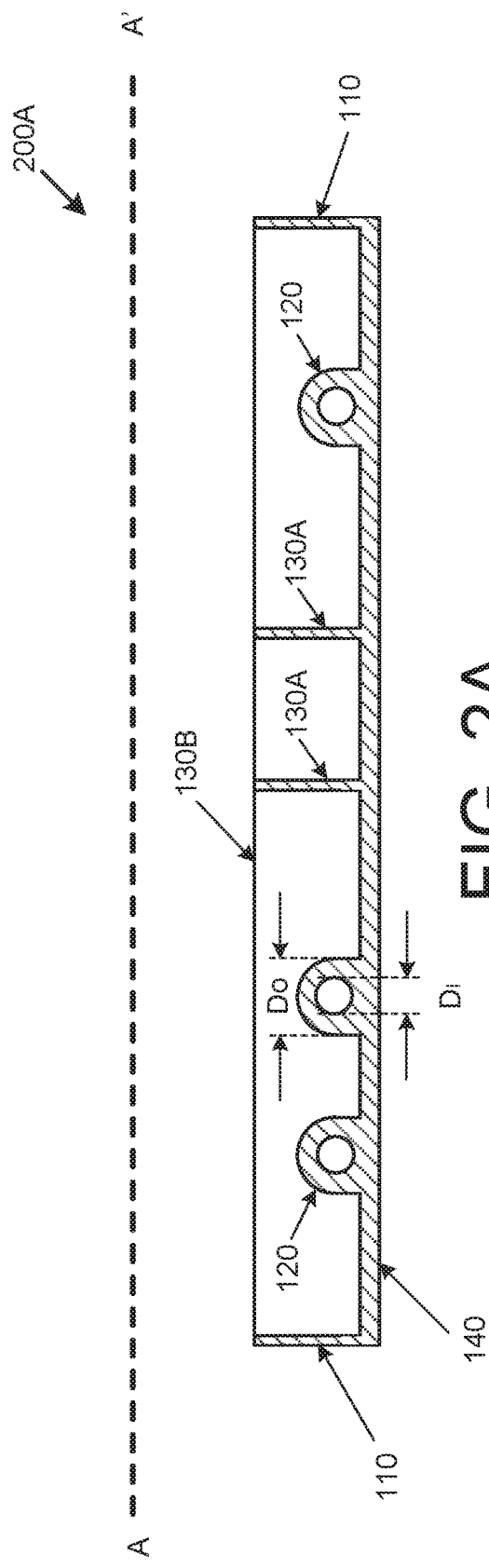
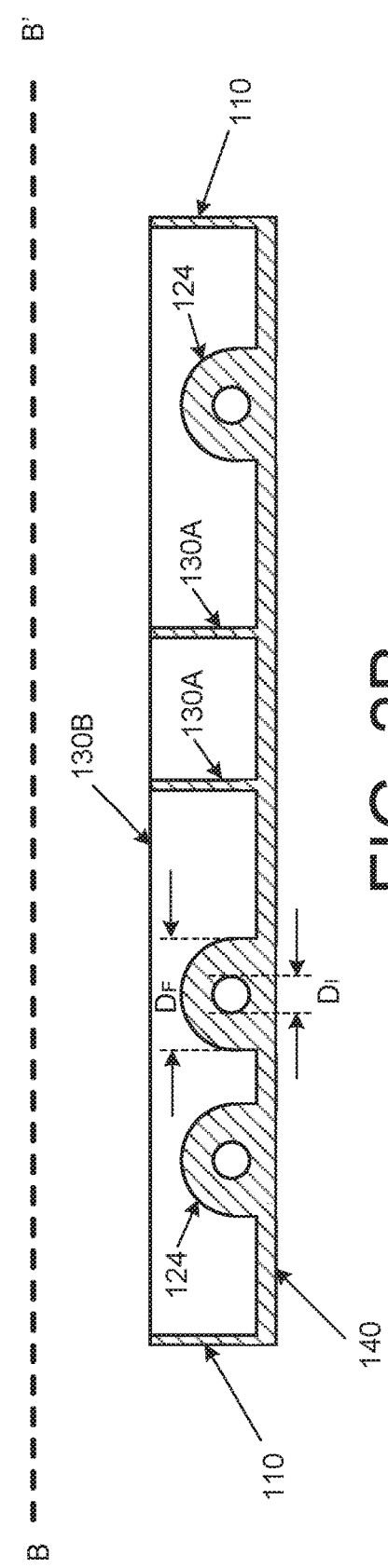

VOID FREE INJECTION-MOLDED COLD PLATES

BACKGROUND

As high-performance electronic systems evolve, such systems tend to generate higher heat loads and thus require more efficient cooling. For many of these electronic systems, traditional air cooling is insufficient. Accordingly, liquid-cooled solutions are becoming more popular as they have a capacity for higher heat transfer and design flexibility. One form of liquid-cooling system is known as a "cold plate." Cold plates have a much smaller profile than heat sinks used in air-cooled solutions for the same application. Additionally, multiple cold plates can be used with the same pump and heat exchanger, thus enabling remote cooling for several devices. A cold plate is generally made of a heat-conductive material with certain portions making contact with high-power electronic components/modules while internal channels of the cold plate circulate some form of cooling medium in order to remove waste heat.

BRIEF DESCRIPTION OF THE DRAWINGS

The invention may be understood by reference to the following description taken in conjunction with the accompanying drawings, in which like reference numerals identify like elements, and in which:

FIGS. 2A and 2B depict cutouts of the cold plate of FIG. 1 in accordance with one or more examples of the present disclosure.

Figure 1:
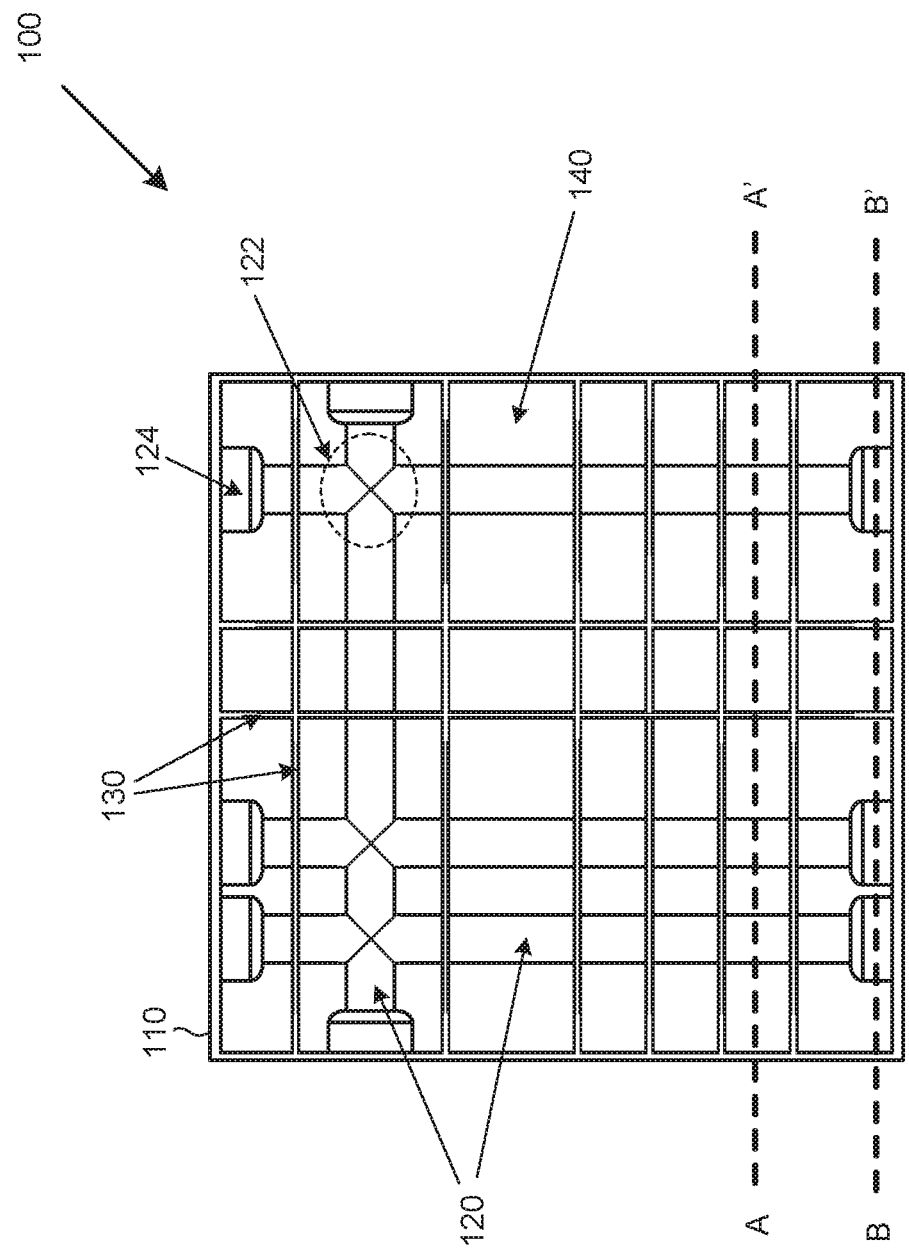
FIG. 1 depicts a cold plate made entirely of injection-molded plastic in accordance with one or more examples of the present disclosure.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The methods and systems disclosed below may be described generally, as well as described in terms of specific examples. For instances where references are made to detailed examples, it is noted that any of the underlying principles described are not to be limited to a single example but may be expanded for use with any of the other methods and systems described herein as will be understood by one of ordinary skill in the art unless otherwise specifically stated.

Escalating power requirements for rack-based Information Technology ("IT") systems have resulted in widespread deployment of liquid-cooling solutions. In addition, customers are pushing for 100% capture of an IT systems' heat, which in effect results in fanless IT systems. To capture most of the heat from their servers, various manufacturers have resorted to using full motherboard cold plates manufactured from Aluminum. Unfortunately, such aluminum cold plates are heavy, expensive, difficult to work with, and create fluid compatibility challenges given aluminum erodes easily. To address this issue other materials suitable for cold plates have been studied, including thermally conductive plastics.

For the purposes of this disclosure the term "thermally-conductive" as it refers to plastics capable of being thermally-injected to form molded items refers to a material having a thermal conductivity of at least 0.7 W/mK (Watts/meter-° Kelvin). Various example thermoplastics may include (by way of non-limiting example) thermoplastics made of resins, such as Nylon 6/6, polycarbonate, high density polyethylene (HDPE), polyphenylene sulfide (PPS), polyphthalamide (PPA), liquid crystal polymer (LCP), and thermoplastic elastomers (TPE). Non-limiting examples of plastics may also have a UL94-V1 or better flammability rating and less than 7000 psi tensile strength and at least 0.5 ft-lbs notched impact strength.

The use of thermally conductive plastics in the IT industry is in its infancy, and a host of manufacturing challenges, such as reliability and cost effectivenness, remain unaddressed. For example, some manufacturing approaches useable for thermally conductive plastics, such as compression molding, have proved unsatisfactory as compression molding results in low density and porous parts, which create mechanical strength and leak concerns. Similarly, molded plastics over copper tubing has proved to be both expensive if the tube network is anything but just straight tube sections, and such molding techniques result in an additional thermal interface between the metal tube and the plastic material, which in turn results in lower overall thermal performance. While 3D printing solutions have been studied, 3D printing has proved to be overly expensive.

Injection molding, while apparently a cost-effective solution to creating cold plates, has certain structural problems. For example, during the injection molding process of a thermally conductive plastic cold plate, voids tend to form within the thickest section of the cold plate. This is because thermally conductive plastics rapidly cool and solidify from the outside moving in, thereby causing tensile stresses to form within the thick sections. These tensil stresses separate thermoplastic materials typically at the center of thick sections so as to create voids. The concern with such voids is that, over time, these voids will propagate due to handling, shock and vibration, thermal cycling, etc., and will eventually reach an external surface, which will allow coolant to leak out of the cold plate. Several design changes, e.g., altering the formulation of the material, modifying the cold plate design, etc., may reduce the severity of the voids but will not entirely eliminate them. The above-discussed void problem is confirmed by laboratory trials. For instance, several samples of an example injected-molded cold plate were placed in a computerized tomography ("CT") scanner, and the results of the scanned devices show prominent voids formed in the regions of the fluid conduits, which also tend to be the thickest sections of the cold plate. Part of the process of manufacturing such cold plates is to drill all the fluid conduits out after the cold plates are made. However, even after the conduits were drilled out, sections of voids were still found in the machined product.

Accordingly, the disclosed methods and systems have been developed to make cold plates made entirely of heat-conductive plastic using a two-step injection-molding process that minimizes the effect of internal voids. That is, a first injection molding process is used to create a first plastic body representing the fluid conduits (with sections of reduced thickness) where, after the plastic product has cooled, a second injection molding process is performed over the first body. In a post-manufacturing process, the fluid conduits are drilled out, resulting in a cold plate having reduced voids. The result is also a cold plate having reduced costs while still able to capture the majority of heat generated in a test system.

FIG. 1 depicts a cold plate 100 made entirely of injection-molded plastic in accordance with one or more examples of the present disclosure. As shown in FIG. 1, the example cold plate 100 includes an outer frame 110 surrounding a number of coolant pipes 120, a number of fins 130, and a bottom plate 140. Each coolant pipe 120 includes a flange 124 at each end in order to provide a better mechanical coupling between the coolant pipes 120 and the outer frame 110. These thicker flange sections also provide better mechanical coupling between the plastic cold plate 100 and fluid lines bringing coolant into and out of the plastic cold plate 100. The flanges 124 may be sized to enable the attachment of a hose barb that uses an o-ring seal to seal to the plastic cold plate 100.

As is also shown in FIG. 1, in certain examples two or more coolant pipes may intersect with one another at substantially right angles at intersections 122. However, it is to be appreciated that the particular angle at which two coolant pipes can intersect may vary as is found advantageous or otherwise desirable. It is to be appreciated that such intersections 122 tend to be the thickest portions of the cold plate 100 and are particularly prone to the formation of internal voids. While not particularly shown in FIG. 1, each coolant pipe 120 makes direct contact with the bottom plate 140 throughout their respective lengths. In various examples, the particular thermoplastic material of the cold plate 100 can vary so long as the efficiency of heat transfer is sufficient to address a particular heat dissipation design.

FIGS. 2A and 2B depict cutouts of the cold plate 100 of FIG. 1 in accordance with one or more examples of the present disclosure. As shown in FIG. 2A (cutout along line A-A' of FIG. 1), a side view of the cold plate 200A demonstrates that each coolant pipe 120 will be a hollow member with the outer diameter of each coolant pipe 120 being Do and the inner diameter of each coolant pipe 120 being Di. FIG. 2A also shows an outer frame 110, a number first fins 130A (facing into the page), a laterally arranged fin 130B (spanning left to right), and a bottom plate 140. The bottom plate 140 provides a flat surface for various electrical and electronic components to interface with. In contrast, as is shown in FIG. 2B (cutout along line B-B' of FIG. 1), a second side view of the cold plate 200B again demonstrates that each coolant pipe 120 will be a hollow member with the outer diameter of each coolant pipe 120 at a flange 124 being DF and the inner diameter of each coolant pipe 120 being Di. FIGS. 2A-2B also demonstrate that the coolant pipes 120, flanges 124, and fins 130A and 130B all make direct contact with the bottom plate 140 throughout their respective lengths so as to provide efficient thermal conduits. Thus, electrical and electronic devices (e.g., a power converter or a number of processors) in contact with the bottom plate 140 can efficiently dissipate heat.

Figure 3:
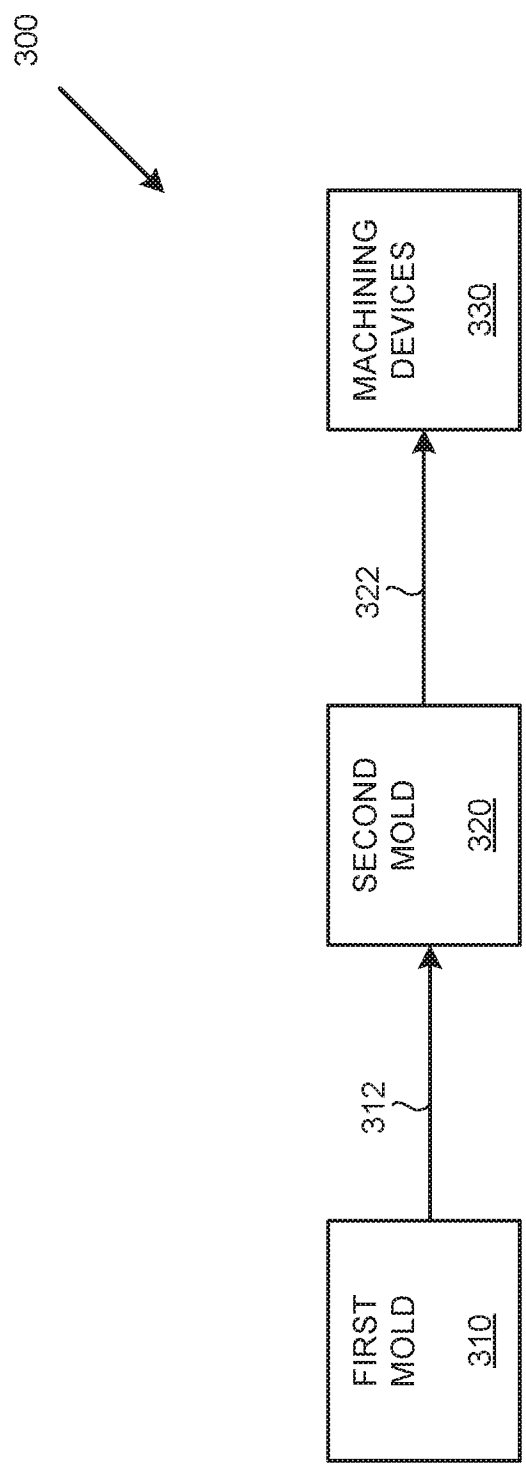
FIG. 3 is a block diagram of a cold plate manufacturing system in accordance with one or more examples of the present disclosure.

FIG. 3 is a block diagram of a cold plate manufacturing system 300 in accordance with one or more examples of the present disclosure. As shown in FIG. 3, the cold plate manufacturing system 300 includes a first mold 310, a second mold 320, and machining equipment 330. A first conveyer 312 couples the first mold 310 to the second mold 320, and a second conveyer 322 couples the second mold 320 to the machining equipment 330. The term "conveyer" as used herein is not limited to any particular type of device but instead can refer to any form of transport mechanism or even refer to a human conveying an object.

Figure 4:
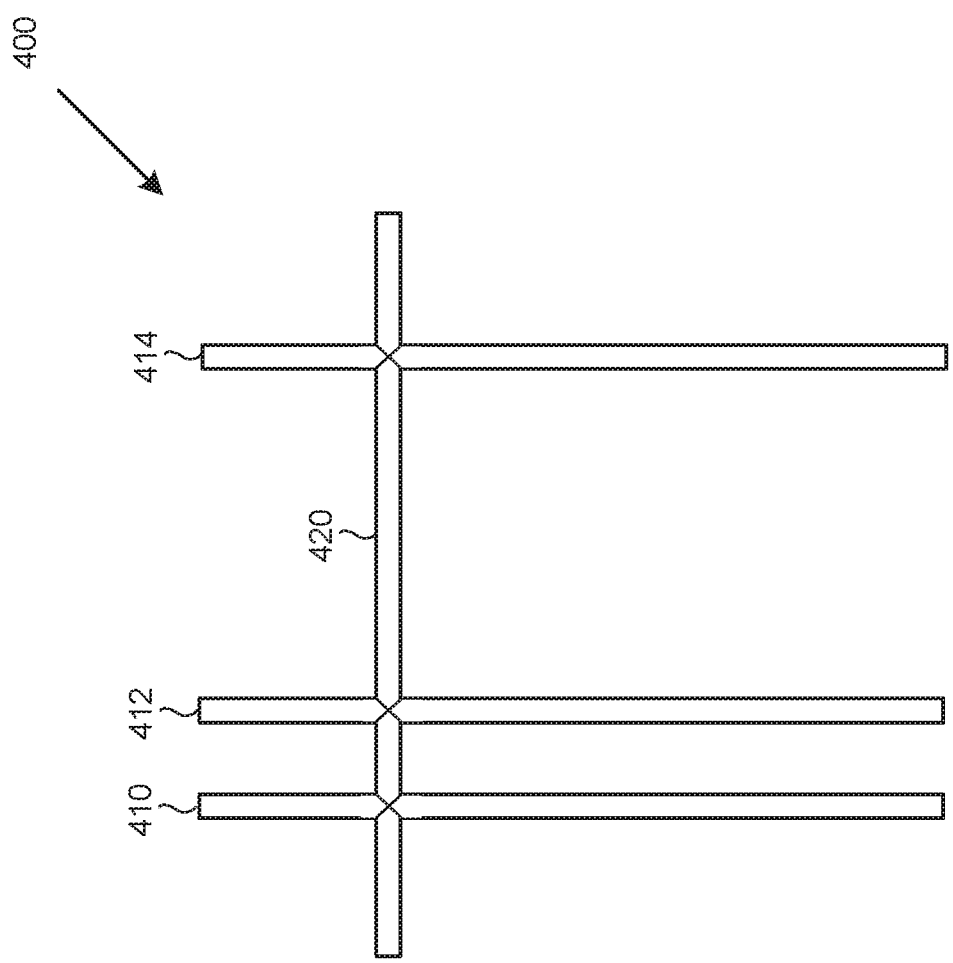
FIG. 4 depicts a first unitary body made of injection molded plastic in accordance with one or more examples of the present disclosure.

The first mold 310 has a first internal shape that enables the first mold 310 to perform a first injection-molding process using a thermally-conductive plastic to produce a first unitary body that includes one or more elongated sections. By way of non-limiting example while observing that different base resins may result in different injection molding parameters, a possible set of injection molding parameters may include: Injection pressure=10,000-18,000 psi, Melt temperature=277-299 C, Mold Temperature=82-121 C (oil coolant used), Drying=4 hours at 79 C, Moisture content=0.20%, and desiccant type dryer used. Turning to FIG. 4, an example first unitary body 400 is depicted, the example first unitary body 400 made of injection molded plastic in accordance with one or more examples of the present disclosure. As shown in FIG. 4, the first unitary body 400 includes three elongated sections 410, 412, and 414 vertically disposed, and still another elongated section 420 laterally disposed in a manner so as to intersect the three vertically disposed elongated sections 410, 412, and 414 so as to create a single, unitary body. In the example of FIG. 4, each elongated body 412, 414, 416, and 420 is a cylindrical body having a length and a round circumference defining a cross-section of the cylindrical body. However, it is to be appreciate that each elongated body 412, 414, 416, and 420 may have a cross-section taking any number of forms, such as triangular, rectangular, pentagonal, oval, and so on.

Figure 5:
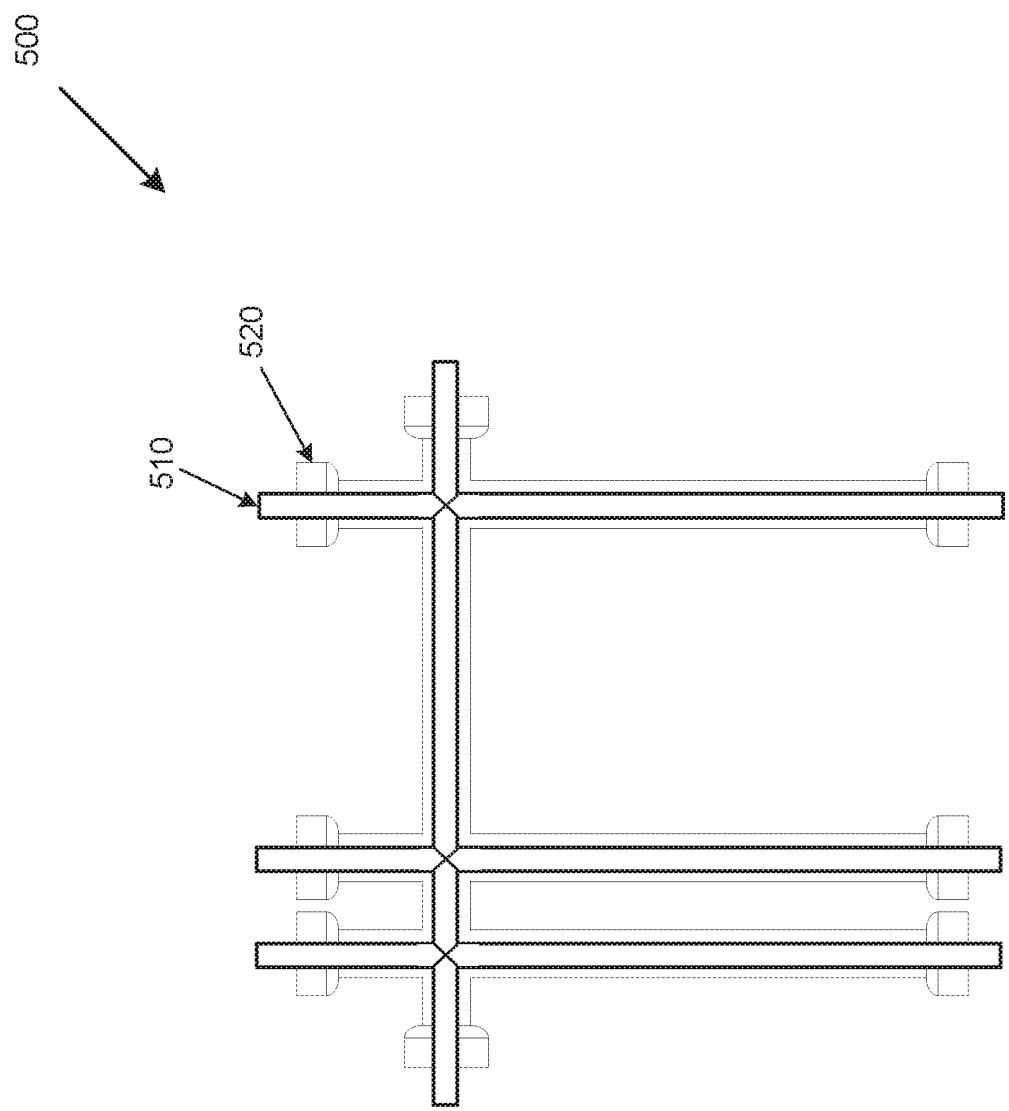
FIG. 5 depicts the example first molded unitary body in comparison to the coolant pipes of an example finished cold plate.
Figure 6:
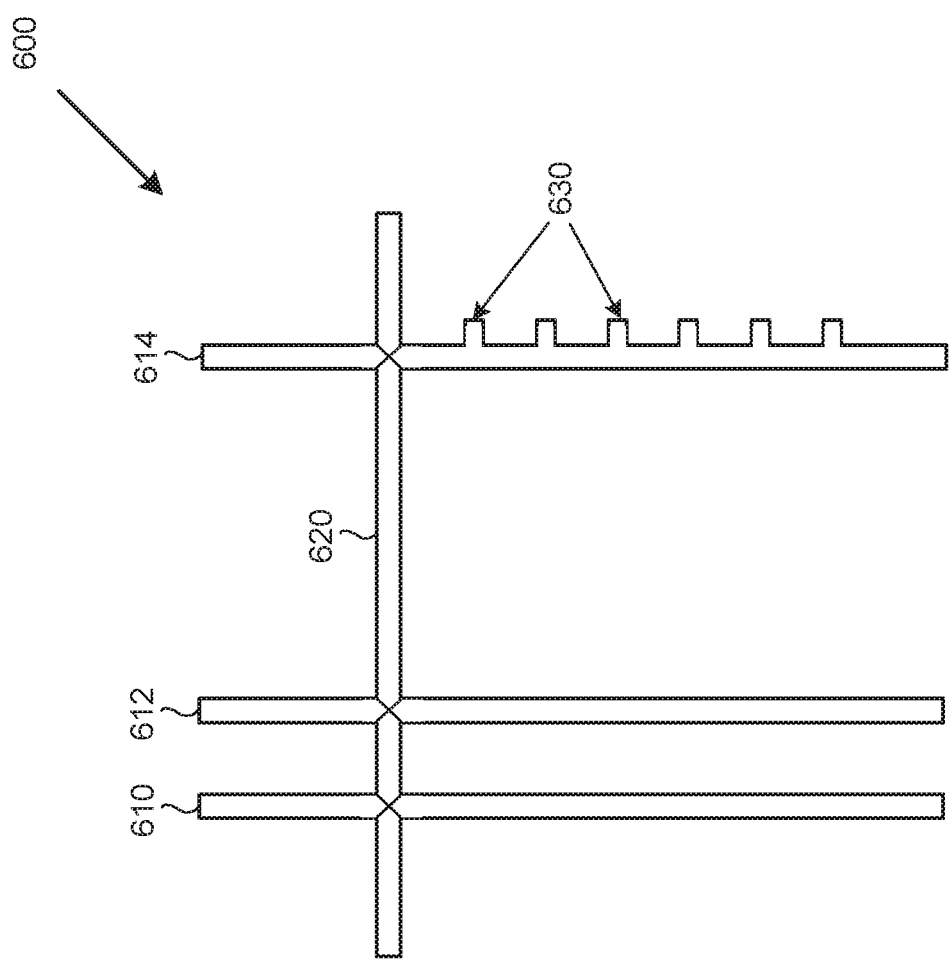
FIG. 6 depicts a variant of the first unitary body made of injection molded plastic in accordance with one or more examples of the present disclosure.

FIG. 5 depicts an example 500 of a first unitary body 510 in comparison to a set of respective coolant pipes 520 of an example cold plate. FIG. 6 depicts a first unitary body variant 600 of the first unitary body made of injection molded plastic in accordance with one or more examples of the present disclosure. As shown in FIG. 6, as with FIG. 4, the first unitary body variant 600 includes three elongated sections 610, 612, and 614 vertically disposed, and another elongated section 620 laterally disposed in a manner so as to intersect the three vertically disposed elongated sections 610, 612, and 614. However, unlike FIG. 4, the elongated section 614 of the first unitary body variant 600 includes a plurality of laterally-extending members 630 used to prevent displacement of elongated section 614 during the second injection-molding process. While only one elongated section is shown to incorporate these laterally-extending members 630, it is to be appreciated any or all of the elongated sections 610, 612, 614, and 620 may incorporate laterally-extending members.

Figure 7:
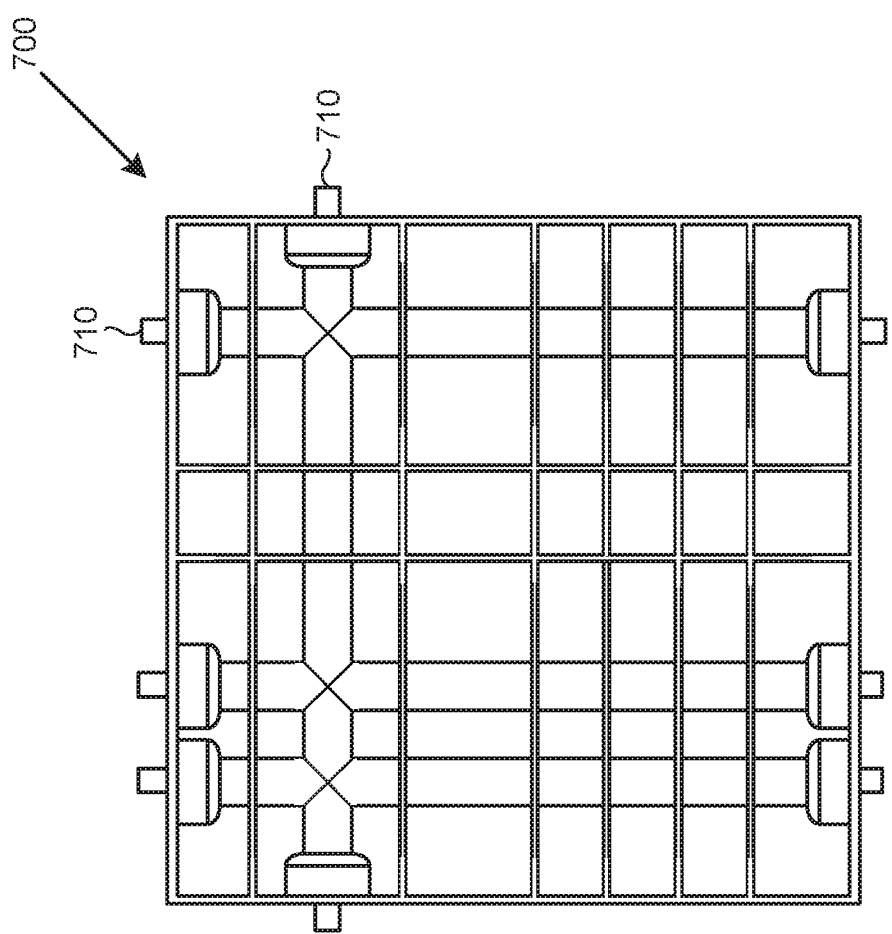
FIG. 7 depicts a second molded unitary body made of injection molded plastic in accordance with one or more examples of the present disclosure.

Returning to FIG. 3, after the first unitary body is formed and sufficiently cooled, the first conveyer 312 moves the first unitary body to the second mold 320. As with the first mold 310, the second mold 320 has an internal shape configured to receive the first unitary body and perform a second injection-molding process using the thermally-conductive plastic to produce a second unitary body. By "sufficiently cooled" it is meant that a particular unitary body has cooled to at least a point where the plastic is a solid and the unitary body will retain a desired form. In examples where one or more elongated sections of a first unitary body include the above-discussed laterally-extending members, the second mold 320 will be appropriately configured to include portions to receive the laterally-extending members so as to better secure the respective elongated sections and thereby prevent displacement of the respective elongated sections during the second injection molding process. Turning to FIG. 7, a second unitary body 700 made of injection molded plastic in accordance with one or more examples of the present disclosure is depicted. As shown in FIG. 7, the second unitary body 700 naturally incorporates the first unitary body 710 so as to cover a majority of the first unitary body 710 and form a coolant pipe body at each elongated section.

Again returning to FIG. 3, it is to be appreciated that a thickness of the plastic molded around each coolant pipe during the second injection-molding process may not exceed a threshold calculated in order to prevent voids from forming in the thermoplastic around the first unitary body of each coolant pipe during the second injection-molding process. It is also to be appreciated that the internal shape of the second mold 320 of FIG. 3 may also include one or more fin portions that each form a fin, and a frame portion to create a frame surrounding each coolant pipe and each fin such that the one or more coolant pipes, the one or more fins, and the frame together can form a second unitary body.

After the second unitary body has sufficiently cooled, the second conveyor 322 may move the second unitary body from the second mold 320 to the machining device 330 where after any number of mechanical operations, such as applying a drill to the second unitary body may be applied so as to create a conduit in each coolant pipe body suitable for a fluid to pass through, which creates coolant pipes from the coolant pipe bodies. In instances where a first coolant pipe and a second coolant pipe intersect with one another, the coolant pipes create a common channel suitable for fluid to pass through in multiple directions. It is again to be appreciated that the thermoplastic layer added around the first unitary body during the second injection molding process is designed to be thin enough to be void-free. As such, even if all the voids are not removed from a coolant pipe body in a machining process, there would be no place for the remaining voids to propagate to the external surface of the cold plate. Accordingly, leak paths are avoided.

Figure 8:
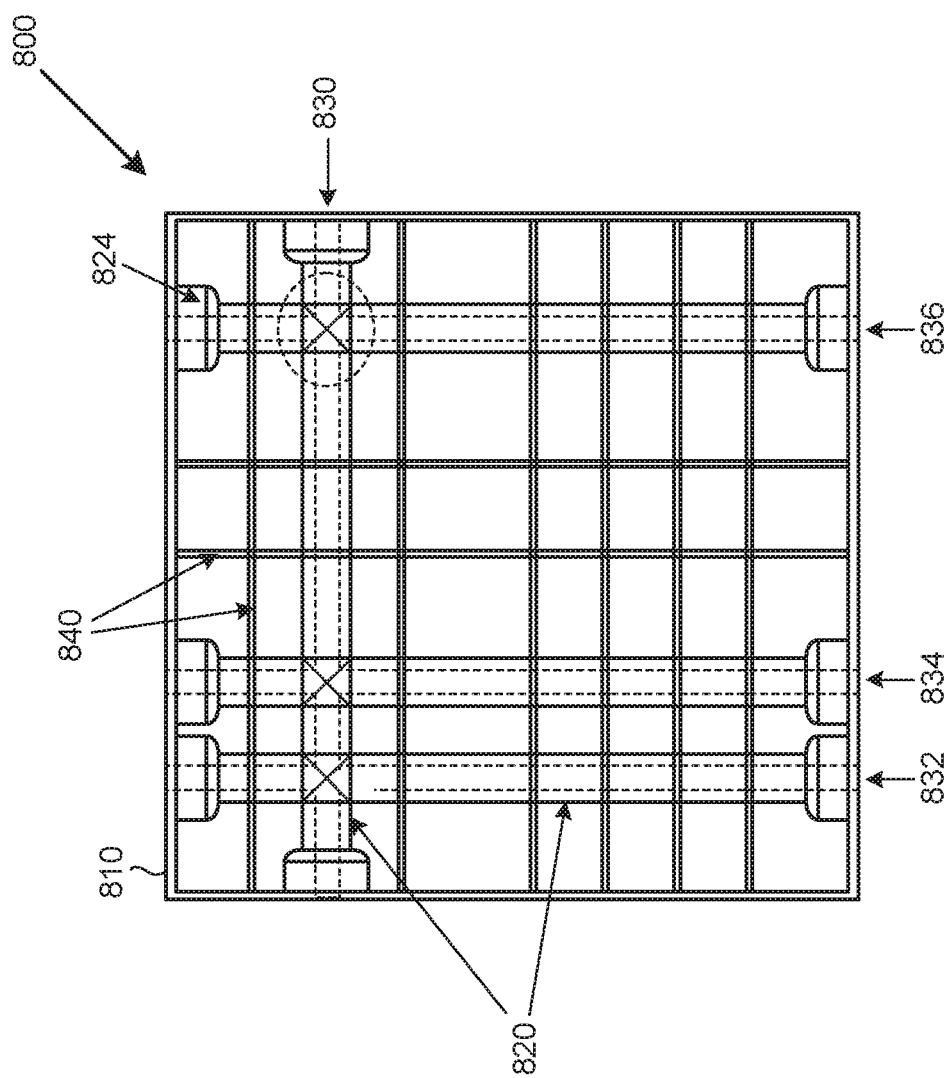
FIG. 8 depicts a third unitary body of a cold plate in accordance with one or more examples of the present disclosure.

FIG. 8 depicts a third unitary body 800 of a cold plate (after machining) in accordance with one or more examples of the present disclosure. As shown in FIG. 8, the example third unitary body 800 of a cold plate includes a frame 810 surrounding a number of coolant pipes 820 and a number of fins 840. Each coolant pipe 820 includes a flange 824 at each end in order to provide a better mechanical coupling between the coolant pipes 820 and the frame 810. As is also shown in FIG. 8, each coolant pipe 820 contains an internal channel 830, 832, 834, and 836 suitable for a fluid to pass through. In various embodiments, as discussed above with respect to FIGS. 2A and 2B, the elongated sections of the unitary body formed during the first injection molding process include a cylindrical portion having a first diameter, and each of the one or more coolant pipe bodies formed during the second injection molding process includes a cylindrical portion having a second diameter. The second diameter will naturally be greater than the first diameter. Depending on the composition of the thermoplastic and the conditions used for molding, it may be advantageous for the diameter of a conduit to be greater than the first diameter of the elongated sections.

However, it is to be appreciated that the various coolant pipes and/or their internal conduits may not be cylindrical. For example, each coolant pipe in a given cold plate may have a rectangular cross-sectional shape, and each of the one or more elongated sections of the unitary body formed during the first injection molding process may have a rectangular cross-sectional shape. Regardless of the particular shape used, a cross-sectional shape of each elongated section will have an outer border, and each of the one or more coolant pipes formed during the second injection molding process will have a cross-sectional shape that surrounds the outer border of its respective elongated section formed during the first injection molded process. Referring to FIG. 4, the "outer border" is a circle defining the circumference of a cylindrical body. In instances such as these it is to be appreciated that there may be examples where the conduit in each coolant pipe does not extend beyond the outer border of the respective elongated member, the conduit in each coolant pipe does indeed extend beyond the outer border of the respective elongated member, and examples where the conduit in each coolant pipe generally follows the outer border of the respective elongated member.

Figure 9:
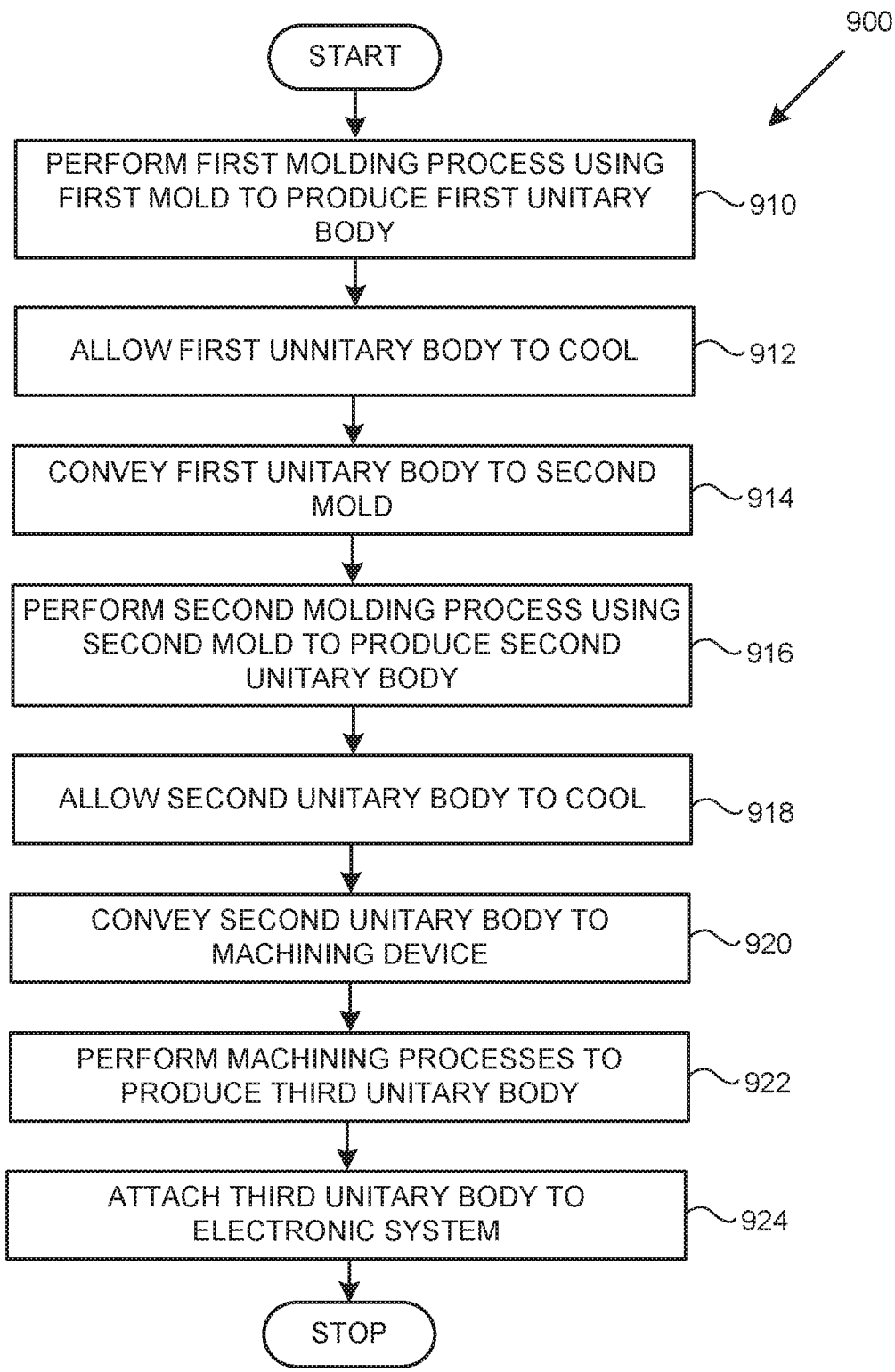
FIG. 9 depicts a flowchart of a method for manufacturing cold plates made of injection molded plastic in accordance with one or more examples of the present disclosure.

FIG. 9 is a flowchart depicting a method 900 for manufacturing cold plates made of injection molded plastic in accordance with one or more examples of the present disclosure. It is to be appreciated to those skilled in the art in light of this disclosure that, while the various operations 910-922 of FIG. 9 are shown according to a particular order for ease of explanation, that certain operations may be performed in different orders or performed in a parallel fashion. Additionally, certain operations may be omitted in some examples.

The method 900 starts in operation 910 where a first injection molding process is performed using a first mold, such as the first mold 310 of FIG. 3. As is discussed above performing such a first injection-molding process using the thermally-conductive plastic may produce a first unitary body that includes one or more elongated sections that will eventually be used to form coolant pipes. Again, turning to FIG. 5, a first unitary body 510 with a plurality of elongated sections is depicted superimposed over the respective coolant pipes 520 the elongated sections will eventually form. Further, as is discussed above with respect to FIG. 6, each elongated section may include a plurality of laterally-extending members 630 usable to prevent bending of the elongated shapes during subsequent processing.

In operation 912, the first unitary body is allowed to sufficiently cool, and in operation 914, the first unitary body is transported/moved to a second mold, such as the second mold 320 of FIG. 3.

In operation 916, a second injection-molding process is performed using the thermally-conductive plastic to produce a second unitary body, the second unitary body incorporating the first unitary body so as to cover a majority of the first unitary body and form a respective coolant pipe body at each elongated section. Also as discussed above the second injection-molding process may further include the formation of one or more fins as well as the formation of a frame surrounding each coolant pipe body and each fin such that the one or more coolant pipe bodies, the one or more fins, and the frame together form the second unitary body. Still further, in various examples a thickness of the plastic added during the second injection-molding process may not exceed a threshold calculated to prevent voids from forming in the thermoplastic located around the elongated section of each coolant pipe body during the second injection-molding process.

In operation 918, the second unitary body is allowed to sufficiently cool, and in operation 920, the second unitary body is conveyed/moved from the second mold to some form of machining equipment, such as the machining equipment 330 of FIG. 3.

In operation 922, a number of machining processes may be performed on the second unitary body to produce a third unitary body. As is discussed above, such machining may include the drilling/removal of internal plastic from each coolant pipe body so as to form internal conduits suitable for conveying some types of fluid thereby forming respective coolant pipes. However, any type of process suitable to remove form an internal conduit, such as grinding, etching, etc., may be used. Generally, each conduit may be machined to remove all voids formed during the first injection-molding process. However, even when removing only a portion of voids, e.g., only a majority of voids, from the first unitary body, the layer added around the first unitary body during the second injection molding process may be designed to be thin enough to be void-free. As such, even if one does not remove all of the voids in the machining process, there would be no place for the remaining voids to propagate to the external surface of the cold plate. Accordingly, leak paths are avoided.

Further, as is discussed above when the coolant pipes and internal conduits take a cylindrical shape, each of the one or more elongated sections of the unitary body formed during the first injection molding process includes a cylindrical portion having a first diameter, and each of the one or more coolant pipe bodies formed during the second injection molding process includes a cylindrical portion having a second diameter, the second diameter being greater than the first diameter. In such examples, the diameter of the conduit may greater than the first diameter, the diameter of the conduit is less than the first diameter, or the diameter of the conduit may be the same as the first diameter.

Still further, in instances where the elongated sections and/or the coolant pipes do not have cylindrical shapes, each of the one or more elongated sections of the unitary body formed during the first injection molding process may be viewed as having a first cross-sectional shape with an outer border, and each of the one or more coolant pipe bodies formed during the second injection molding process will have a second cross-sectional shape that surrounds the outer border of its respective elongated section formed during the first injection molded process. In such instances, the conduit in each coolant pipe may be formed so as to not extend beyond the outer border of the respective elongated member, the conduit in each coolant pipe may be formed so as to extend beyond the outer border of the respective elongated member, or the conduit in each coolant pipe may be formed so as follow the contour of the outer border of the respective elongated member.

In operation 924, the third unitary body formed by operation 922 is attached to some form of electronic equipment where after the method 900 stops.

While the methods and systems above are described in conjunction with specific examples, it is evident that many alternatives, modifications, and variations will be apparent to those skilled in the art. Accordingly, the examples above as set forth herein are intended to be illustrative, not limiting. There are changes that may be made without departing from the scope of the present disclosure.

What is claimed is:

1. A method for manufacturing a cold plate made of a thermally-conductive plastic for liquid cooling a computing component, comprising:
    performing a first injection-molding process using the thermally-conductive plastic to produce a first unitary body that includes one or more elongated sections filled with the thermally-conductive plastic;
    performing a second injection-molding process using the thermally-conductive plastic to produce a second unitary body, the second unitary body incorporating the first unitary body so as to radially encircle each of the elongated sections and form one or more coolant pipe bodies each comprising a core corresponding to one of the elongated sections; and
    machining the second unitary body to remove the core of each of the coolant pipe bodies to create a conduit in each of the respective coolant pipe bodies suitable for a fluid to pass through to create respective coolant pipes.

2. The method of claim 1, further comprising limiting a thickness of the thermally-conductive plastic added during the second injection-molding process to not exceed a predetermined threshold.

3. The method of claim 2, wherein performing the second injection-molding process further includes forming a bottom plate that makes contact with each coolant pipe body, one or more fins, and a frame surrounding a periphery of the bottom plate and each fin such that the bottom plate, the one or more coolant pipe bodies, the one or more fins, and the frame form the second unitary body.

4. The method of claim 3, wherein:
    the second unitary body includes a first coolant pipe and a second coolant pipe that intersect with one another to create a common channel suitable for fluid to pass through; and
    each coolant pipe makes contact with the bottom plate throughout a length of each coolant pipe.

5. The method of claim 1, wherein:
    each of the one or more elongated sections of the first unitary body formed during the first injection molding process includes a cylindrical portion having a first diameter;
    each of the one or more coolant pipe bodies formed during the second injection molding process includes a second cylindrical portion having a second diameter, the second diameter being greater than the first diameter;
    at least one flange is formed for each of the one or more coolant pipe bodies during the second injection molding process; and
    a third diameter of the conduit is greater than the first diameter.

6. The method of claim 1, wherein:
    each of the one or more elongated sections of the first unitary body formed during the first injection molding process includes a cylindrical portion having a first diameter;
    each of the one or more coolant pipe bodies formed during the second injection molding process includes a second cylindrical portion having a second diameter, the second diameter being greater than the first diameter;
    at least one flange is formed for each of the one or more coolant pipe bodies during the second injection molding process; and
    a third diameter of the conduit is less than the first diameter.

7. The method of claim 1, wherein:
each of the one or more elongated sections of the first unitary body formed during the first injection molding process includes a cylindrical portion having a first diameter;
each of the one or more coolant pipe bodies formed during the second injection molding process includes a cylindrical portion having a second diameter, the second diameter being greater than the first diameter;
at least one flange is formed for each of the one or more coolant pipe bodies during the second injection molding process; and
a diameter of the conduit is the same as the first diameter.

8. The method of claim 1, wherein:
each of the one or more elongated sections of the first unitary body formed during the first injection molding process has a first cross-sectional shape having an outer border;
each of the one or more coolant pipe bodies formed during the second injection molding process has a second cross-sectional shape that surrounds the outer border of its respective elongated section formed during the first injection molding process;
at least one flange is formed for each of the one or more coolant pipe bodies during the second injection molding process; and
the conduit in each coolant pipe body extends beyond the outer border of the corresponding elongated member.

9. The method of claim 1, wherein:
each of the one or more elongated sections of the first unitary body formed during the first injection molding process has a first cross-sectional shape having an outer border;
each of the one or more coolant pipe bodies formed during the second injection molding process has a second cross-sectional shape that surrounds the outer border of its respective elongated section formed during the first injection molding process; and
the conduit in each coolant pipe body does not extend beyond the outer border of the corresponding elongated member.

10. The method of claim 1, wherein:
at least one elongated section of the first unitary body includes a plurality of laterally-extending members used to prevent bending of the at least one elongated section during the second injection-molding process.

11. A method for manufacturing a cold plate for liquid cooling a computing component, comprising:
performing a first injection-molding process using a thermally-conductive plastic to produce a first unitary body, the first unitary body including one or more elongated sections filled with the thermally-conductive plastic;
performing a second injection-molding process using the thermally-conductive plastic to produce a second unitary body, the second unitary body incorporating the first unitary body so as to radially encircle each of the elongated sections and form one or more coolant pipe bodies each comprising a core corresponding to one of the elongated sections, wherein performing the second injection-molding process includes forming a bottom plate that makes contact with the coolant pipe bodies throughout respective lengths of the coolant pipe bodies, one or more fins, and a frame surrounding a periphery of the bottom plate and each fin such that the bottom plate, the one or more coolant pipe bodies, the one or more fins, and the frame form the second unitary body;
machining the second unitary body to remove the core of each of the coolant pipe bodies to create a conduit in each of the respective coolant pipe bodies suitable for a fluid to pass through to create a third unitary body; and
attaching the third unitary body to an electronic system with the bottom plate thermally coupled to one or more electrical components.

12. The method of claim 11, comprising limiting a thickness of the thermally-conductive plastic added around each elongated section during the second injection-molding process to not exceed a predetermined threshold.

* * * * *